(12) United States Patent
Wachs et al.

(10) Patent No.: US 6,238,939 B1
(45) Date of Patent: May 29, 2001

(54) METHOD OF QUALITY CONTROL IN SEMICONDUCTOR DEVICE FABRICATION

(75) Inventors: Amir Wachs, Haifa; David Cohen, Nesher, both of (IL)

(73) Assignee: Tower Semiconductor Ltd., Migdal Haemex (IL)

( * ) Notice: Subject to any disclaimer, the term of this patent is extended or adjusted under 35 U.S.C. 154(b) by 0 days.

(21) Appl. No.: 09/302,183

(22) Filed: Apr. 30, 1999

(51) Int. Cl.[7] .................................................. G01R 31/26
(52) U.S. Cl. ............................ 438/14; 437/465; 382/151
(58) Field of Search ........................ 250/372; 356/237.2; 438/639, 14; 324/719; 454/193

(56) References Cited

U.S. PATENT DOCUMENTS

| | | | |
|---|---|---|---|
| 5,401,691 | * | 3/1995 | Caldwell ............................ 437/465 |
| 5,808,330 | * | 9/1998 | Rostoker ............................ 257/208 |
| 5,952,135 | * | 9/1999 | Ghandehari ........................ 430/22 |
| 5,986,338 | * | 11/1999 | Nakagima ......................... 257/700 |
| 6,016,358 | * | 1/2000 | Balamurugan ..................... 382/151 |
| 6,083,807 | * | 7/2000 | Chungwei .......................... 438/401 |
| 8,933,744 | * | 8/1999 | Chen ................................. 438/401 |

\* cited by examiner

*Primary Examiner*—John F. Niebling
*Assistant Examiner*—André C Stevenson
(74) *Attorney, Agent, or Firm*—Mark M. Friedman

(57) ABSTRACT

A method of quality control in the fabrication of semiconductor devices. During and after the deposition and patterning of two successive layers on a semiconductor wafer, two independent measures of the alignment of the two layers are obtained. From each of these measures of the alignment, there is obtained a measure of the quality of a corresponding model of the alignment. These two measures of the quality of the models are compared. In one preferred independent measure of model quality, the model is a model of upper layer misalignment that is constructed by the stepper that positions the wafer for the patterning of the upper layer. In another preferred independent measure of model quality, the model is a model of mutual layer misalignment that is determined from mutual displacement of the overlay keys of the two layers. The measures of model quality are based on the residuals of these models.

12 Claims, 5 Drawing Sheets

Scaling

Orthogonality - X Rotation

Magnification

Rotation

Reticle Rotation

Translation

METHOD OF QUALITY CONTROL IN SEMICONDUCTOR DEVICE FABRICATION

FIELD AND BACKGROUND OF THE INVENTION

The present invention relates to semiconductor device fabrication and, more particularly, to a method of fabrication quality control, based on monitoring the alignment of two layers deposited successively on a semiconductor wafer.

Semiconductor devices, such as processor chips and memory chips, are fabricated by the deposition of successive layers of substances such as polysilicon, silicon dioxide and various metals on a silicon wafer substrate. As shown in FIG. 1, the devices are fabricated as dies 10, separated by scribes 12, on a wafer 14. After each layer is deposited, it is covered with photoresist. The photoresist is exposed to a preselected pattern of light. Depending on the type of photoresist, a portion of the photoresist, either the portion that was exposed to the light or the portion that was not exposed to the light, is removed, usually by dissolution, exposing the layer beneath the photoresist. The thus exposed part of the new layer is either totally or partially removed, for example by etching, to provide the layer with its desired geometry.

The exposure of the photoresist to the light pattern is effected using a tool called a "stepper". The desired two-dimensional geometric pattern of the layer is embodied in a reticle, either in a transparent portion of the reticle or in an opaque portion of the reticle. Collimated light is directed through the reticle, and focused on a portion of the wafer. The portion of the wafer upon which the light is directed at any one time is known in the art as a "field". The fields in FIG. 1 are demarcated by dotted lines 16. In this example, each field spans four dies 10.

It is critical that successive layers be aligned accurately. For this purpose, the reticle includes alignment key portions in the portion of the reticle corresponding to scribes 12. FIG. 2 shows, schematically, a typical reticle pattern 18, including die portions 20 corresponding to four dies 10, scribe portions 22 corresponding to scribes 12 that separated dies 10, and, in scribe portions 22, two alignment key portions 24 corresponding to Cartesian x and y axes. After the corresponding layer on wafer 14 has been provided with its desired geometry, as described above, the layer includes, in scribes 12, and as shown in FIG. 1, alignment keys 26 whose geometry matches the geometry of alignment key portions 24. The geometry of alignment key portions 24 is designed so that the two-dimensional pattern of alignment keys 26 shows up both in the layer in which alignment keys 26 are fabricated and in the immediately succeeding layer, so that wafer 14 can be positioned accurately by the stepper, relative to the reticle of the succeeding layer, for the accurate patterning of the succeeding layer relative to the layer that bears alignment keys 26. Because alignment keys 26 are used specifically by the stepper to effect this alignment, alignment keys 26 are termed "stepper keys" herein.

To verify the accuracy of the mutual alignment of two layers on wafer 14, reticle 18 also includes overlay key portions 28 that typically are square as shown. Overlay key portions 28 for successive layers have different sizes, with the overlay key portion of the lower of a pair of successive layers (termed herein the "first" layer) being larger than the overlay key portion of the upper of a pair of successive layers (termed herein the "second" layer). The two layers, when finally formed with their desired geometries, include corresponding square portions that are termed "overlay keys" herein. If the second layer is aligned accurately with the first layer, then the overlay keys of the second layer are at their nominal (designed) positions relative to the overlay keys of the first layer, i.e., exactly in the centers of the corresponding overlay keys of the first layer. Deviations of the actual positions of the overlay keys of the second layer, relative to the overlay keys of the first layer, from this central positioning are diagnostic of misalignment between the first and second layers. FIG. 3 shows a microphotograph of an overlay key 30 of a second layer of photoresist centered in an overlay key 34 of a first layer 36 of metal.

The stepper positions wafer 14, for exposure to light through the reticle corresponding to the second layer, by searching for and locating geometric patterns of stepper keys 26 that are located approximately in the expected ("nominal") positions of stepper keys 26. Usually, stepper keys 26 are not located precisely in their nominal positions, but instead are slightly displaced relative to their nominal positions. The stepper constructs a mathematical model of this displacement and positions wafer 14 accordingly to adjust the locations of fields 16 for the second layer. This model is termed herein the "stepper model".

After the second layer is fabricated, wafer 14 is transferred to an overlay measurement tool for evaluating the accuracy of the mutual alignment of the first and second layers, as represented by the accuracy of the mutual alignment of the first and second overlay keys. Like the stepper, the overlay measurement tool constructs its own mathematical model, termed herein the "overlay model", of the misalignment of the second layer relative to the first layer.

FIG. 4 shows six ways in which fields 16' of the second layer can be misaligned with respect to fields 16 of the first layer. FIG. 4A shows scaling: the overall size of the geometric pattern defined by fields 16' is larger than the overall size of the geometric pattern defined by fields 16. Isotropic scaling is shown in FIG. 4A. Scaling can also be anisotropic, with different magnifications in the x and y directions. FIG. 4B shows orthogonal x-rotation: fields 16' are skewed horizontally relative to fields 16. FIG. 4C shows rigid rotation of fields 16' relative to fields 16. FIG. 4D shows magnification of individual fields 16' relative to corresponding fields 16. FIG. 4E shows rotation of individual fields 16' relative to corresponding fields 16 as a consequence of reticle rotation. FIG. 4F shows vertical translation: fields 16' are shifted vertically relative to fields 16. For illustrational clarity, only nine fields 16 and 16' are shown in each of FIGS. 4A, 4B, 4C, 4D, 4E and 4F. The six modes of misalignment shown in FIG. 4, plus horizontal translation, are the degrees of freedom of the overlay model. (Orthogonal y-rotation can be expressed as a combination of rigid rotation and orthogonal x-rotation.) The same modes of misalignment, with the exception of magnification and reticle rotation, are the degrees of freedom of the stepper model.

The residuals of the overlay model, ie., the differences between the actual Cartesian (x,y) coordinates of the overlay keys of the first layer, in a coordinate system defined by the second layer, and the Cartesian coordinates of the overlay keys of the first layer that are predicted by the overlay model, are diagnostic of the quality of the overlay model. Large absolute values of the residuals indicate that the model fails to explain the misalignment. This failure is in turn diagnostic of problems in the fabrication process. Similarly, the residuals of the stepper model, ie., the differences between the measured Cartesian coordinates of the stepper keys and the coordinates of the stepper keys that are predicted by the stepper model, are diagnostic of the quality of the stepper model. In practice, only the overlay model residuals are used for quality control of the fabrication process, because only the overlay model is directly related to the actual degree of misalignment of the first and second layers. Although the stepper calculates stepper model residuals for each wafer 14 processed therein, these stepper model residuals are used only for calibrating the stepper during installation and for stepper maintenance.

SUMMARY OF THE INVENTION

According to the present invention there is provided a method of monitoring the quality of a fabrication process of dies on a wafer by deposition on the wafer of a first layer and a second layer, the dies being separated by scribes, the method including the steps of: (a) obtaining a first measure of an alignment of the second layer relative to the first layer; (b) obtaining a second measure of the alignment of the second layer relative to the first layer; (c) obtaining a measure of a quality of a first model of the alignment, based on the first measure of the alignment; (d) obtaining a measure of a quality of a second model of the alignment, based on the second measure of the alignment; and (e) combining the measure of the quality of the first model with the measure of the quality of the second model.

According to the present invention, the stepper model residuals-are not ignored during routine fabrication of semiconductor devices. Instead, the stepper model residuals and the overlay model residuals, being two independent indications of problems in the fabrication process, are compared to each other to diagnose problems in the fabrication process. The combination of low values of the stepper model residuals and low values of the overlay model residuals indicates that the fabrication process is proceeding normally. The combination of low values of the stepper model residuals and high values of the overlay model residuals indicates measurement noise in the overlay measurement tool. The combination of high values of the stepper model residuals and low values of the overlay model residuals indicates inaccurate locating of the stepper keys by the stepper. The combination of high values of the stepper model residuals with high values of the overlay model residuals indicates distortion of wafer 14.

Preferably, the measures of the quality of the stepper and overlay models are not the residuals themselves, but rather statistics of the residuals. The preferred statistic is the standard deviation of the residuals.

BRIEF DESCRIPTION OF THE DRAWINGS

The invention is herein described, by way of example only, with reference to the accompanying drawings, wherein.

DESCRIPTION OF THE PREFERRED EMBODIMENTS

Figure 1:
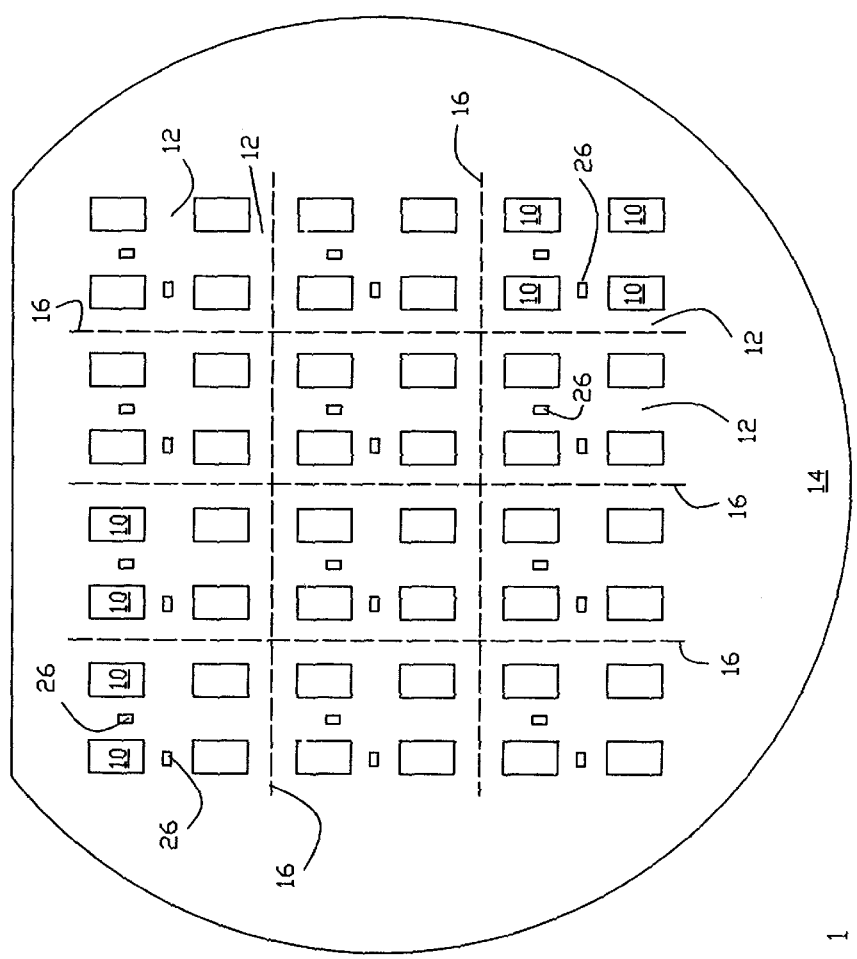
FIG. 1 is a plan view of a silicon wafer, showing semiconductor devices under fabrication.
Figure 2:
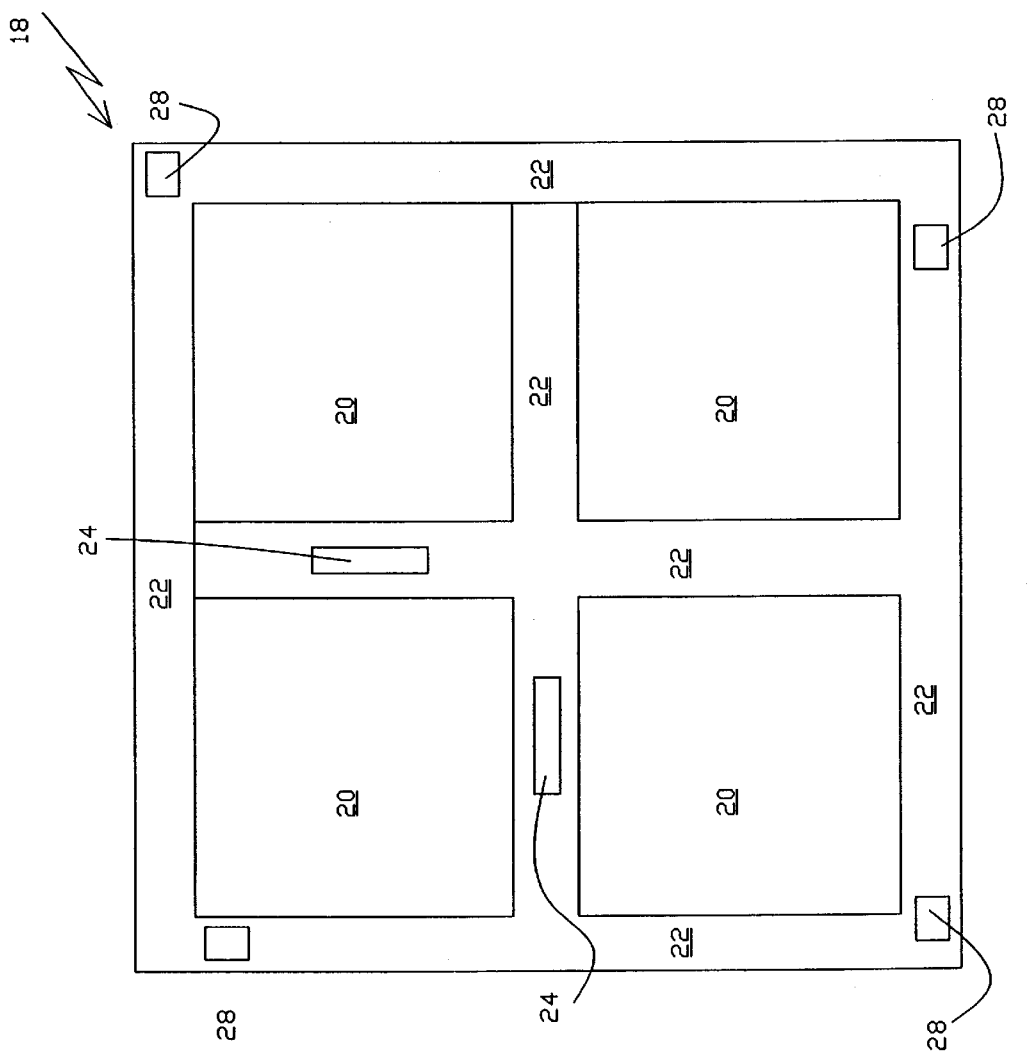
FIG. 2 is a schematic depiction of a reticle.
Figure 3:
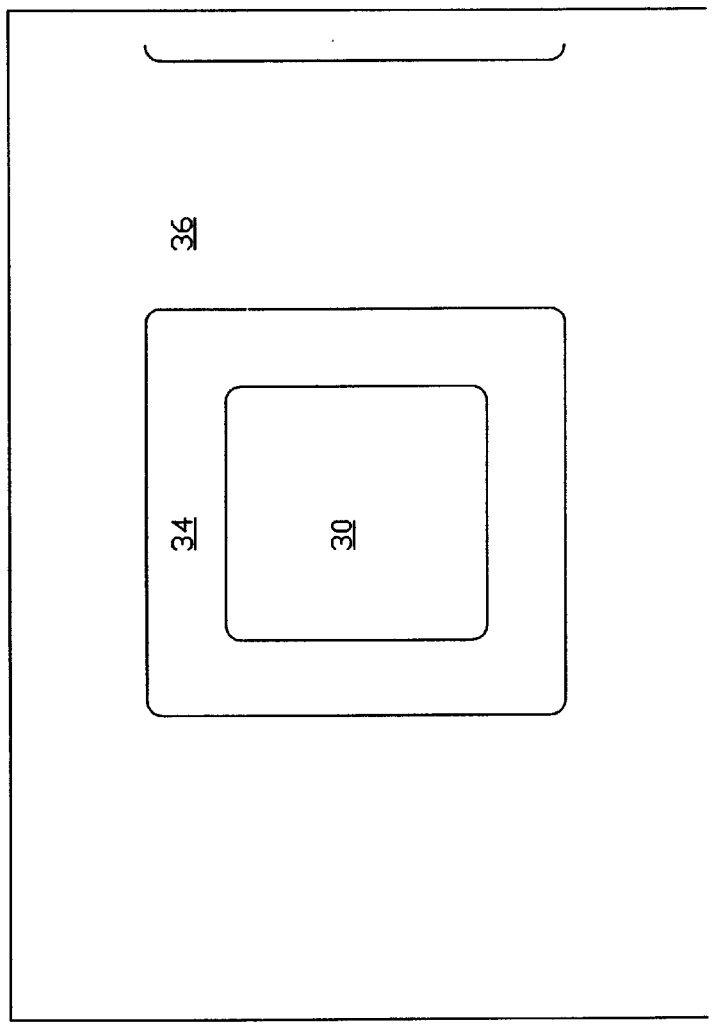
FIG. 3 is a microphotograph of properly aligned overlay keys.
Figure 4A:
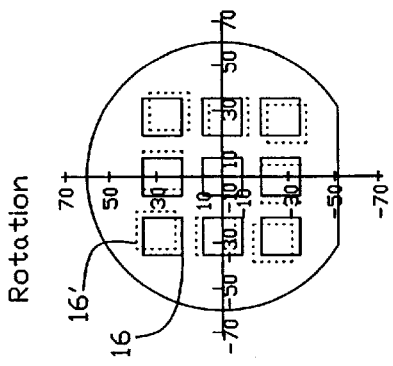
FIGS. 4A–4F illustrate six different modes of misalignment.
Figure 4B:
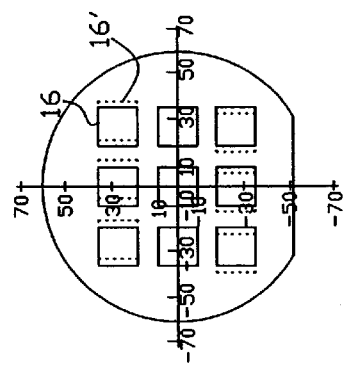
Figure 4D:
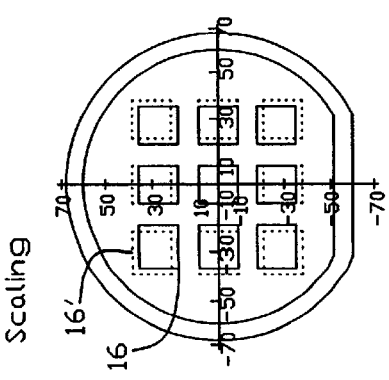
Figure 4C:
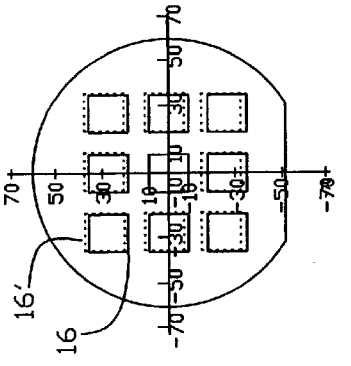
Figure 4E:
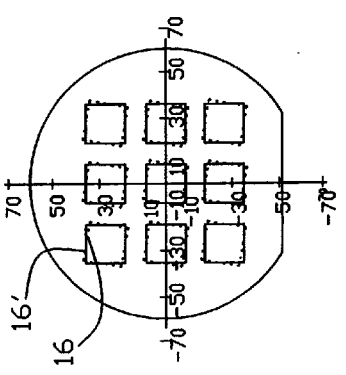
Figure 4F:
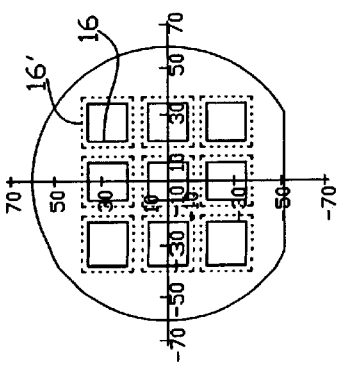

The present invention is of a method of quality control of the fabrication of semiconductor devices, based on monitoring the alignment of two successively deposited layers.

The principles and operation of quality control according to the present invention may be better understood with reference to the drawings and the accompanying description.

The first two columns of Table 1 are the displacements, in x and y, of overlay keys of a layer of photoresist from the centers of corresponding overlay keys of a layer of metal, as measured by a KLA 5100 overlay measurement tool, manufactured by KLA Instruments Co., San Jose Calif. The last two columns are the corresponding residuals, in x and y, after fitting an overlay model to the displacements.

TABLE 1

| displacement (nm) | | residual (nm) | |
|---|---|---|---|
| x | y | x | y |
| 0.071 | 0.010 | −0.002 | −0.018 |
| 0.060 | 0.030 | −0.010 | −0.008 |
| 0.057 | 0.040 | −0.004 | −0.006 |
| 0.064 | 0.030 | −0.003 | −0.017 |
| 0.078 | 0.020 | 0.000 | −0.009 |
| −0.032 | 0.005 | −0.008 | −0.012 |
| −0.035 | 0.019 | −0.008 | −0.008 |
| −0.040 | 0.032 | −0.004 | −0.003 |
| −0.035 | 0.024 | −0.005 | −0.012 |
| −0.025 | 0.017 | −0.006 | −0.002 |
| 0.102 | −0.047 | 0.021 | 0.002 |
| 0.092 | −0.035 | 0.014 | 0.004 |
| 0.088 | −0.024 | 0.018 | 0.007 |
| 0.094 | −0.028 | 0.019 | 0.001 |
| 0.109 | −0.041 | 0.022 | 0.006 |
| −0.024 | −0.049 | −0.008 | 0.011 |
| −0.031 | −0.032 | −0.012 | 0.018 |
| −0.033 | −0.026 | −0.006 | 0.016 |
| −0.030 | −0.029 | −0.008 | 0.011 |
| −0.021 | −0.039 | −0.011 | 0.019 |

The parameters of the corresponding overlay model are given in Table 2:

TABLE 2

| parameter | value | units |
|---|---|---|
| x-translation | −0.02970 | μm |
| y-translation | 0.01020 | μm |
| x-scale | −0.22800 | ppm |
| y-scale | −0.24100 | ppm |
| rigid rotation | 0.21500 | μrad |
| orthogonal x-rotation | −0.28900 | μrad |
| magnification | 5.33000 | ppm |
| reticle rotation | 0.60100 | μrad |

The statistics of the displacements and of the residuals are given in Table 3:

TABLE 3

| | displacement (nm) | | residual (nm) | |
|---|---|---|---|---|
| | x | y | x | y |
| mean | 0.025 | −0.006 | 0.000 | 0.000 |
| 3σ | 0.177 | 0.093 | 0.035 | 0.034 |
| \|mean\| + 3σ | 0.202 | 0.099 | 0.035 | 0.034 |
| maximum | 0.109 | 0.040 | 0.022 | 0.019 |
| minimum | −0.040 | −0.049 | −0.012 | −0.018 |
| range | 0.149 | 0.089 | 0.034 | 0.037 |

The first two columns of Table 4 are the displacements, in x and y, of stepper keys of a photoresist-on-metal layer from their nominal positions, as measured by a NSR2005iD11 stepper, manufactured by Nikon Precision Inc. of Belmont Calif. The last two columns are the corresponding residuals, in x and y, after fitting a stepper model to the displacements.

TABLE 4

| displacement (nm) | | residual (nm) | |
| --- | --- | --- | --- |
| x | y | x | y |
| −0.673 | 0.645 | 0.002 | 0.013 |
| −0.614 | 0.188 | 0.006 | −0.022 |
| −0.141 | 0.637 | 0.012 | 0.036 |
| −0.575 | −0.231 | −0.008 | −0.019 |
| −0.523 | −0.635 | −0.011 | −0.001 |
| 0.082 | −1.106 | 0.019 | −0.020 |
| 0.596 | −1.078 | 0.012 | 0.039 |
| 0.973 | −0.314 | −0.026 | −0.010 |
| 0.972 | 0.084 | 0.027 | −0.034 |
| 0.917 | 0.528 | 0.027 | −0.012 |
| 0.327 | 0.587 | −0.042 | 0.017 |
| 1.033 | −0.712 | −0.019 | 0.014 |

The parameters of the corresponding overlay model are given in Table 5:

TABLE 5

| parameter | value | units |
| --- | --- | --- |
| x-translation | 0.062 | $\mu$m |
| y-translation | −0.043 | $\mu$m |
| x-scale | −3.028 | ppm |
| y-scale | 1.540 | ppm |
| rigid rotation | 23.700 | $\mu$rad |
| orthogonal x-rotation | 2.475 | $\mu$rad |

The statistics of the displacements and of the residuals are given in Table 6:

TABLE 6

| | displacement (nm) | | residual (nm) | |
| --- | --- | --- | --- | --- |
| | x | y | x | y |
| mean | 0.198 | −0.117 | 0.000 | 0.000 |
| 3σ | 2.073 | 1.976 | 0.065 | 0.071 |
| maximum | 1.033 | 0.645 | 0.027 | 0.039 |
| minimum | −0.673 | −1.106 | −0.042 | −0.034 |
| range | 1.706 | 1.751 | 0.069 | 0.073 |

The preferred statistics for comparing the stepper model residuals to the overlay model residuals are the standard deviations σ of the residuals. In the particular processes for which Tables 3 and 6 provide statistics, $\sigma \leq 10$ nm ($3\sigma \leq 30$ nm) is considered low and $\sigma \geq 40$ nm ($3\sigma \geq 120$ nm) is considered high.

The combination of low residual values on the stepper and low residual values on the overlay measurement tool indicates nominal fabrication.

The combination of low residual values on the stepper and high residual values on the overlay measurement tool indicates measurement noise in the overlay measurement tool, possibly resulting from the second layer having a grainy surface or from the overlay measurement tool not focusing well.

Figure 5:
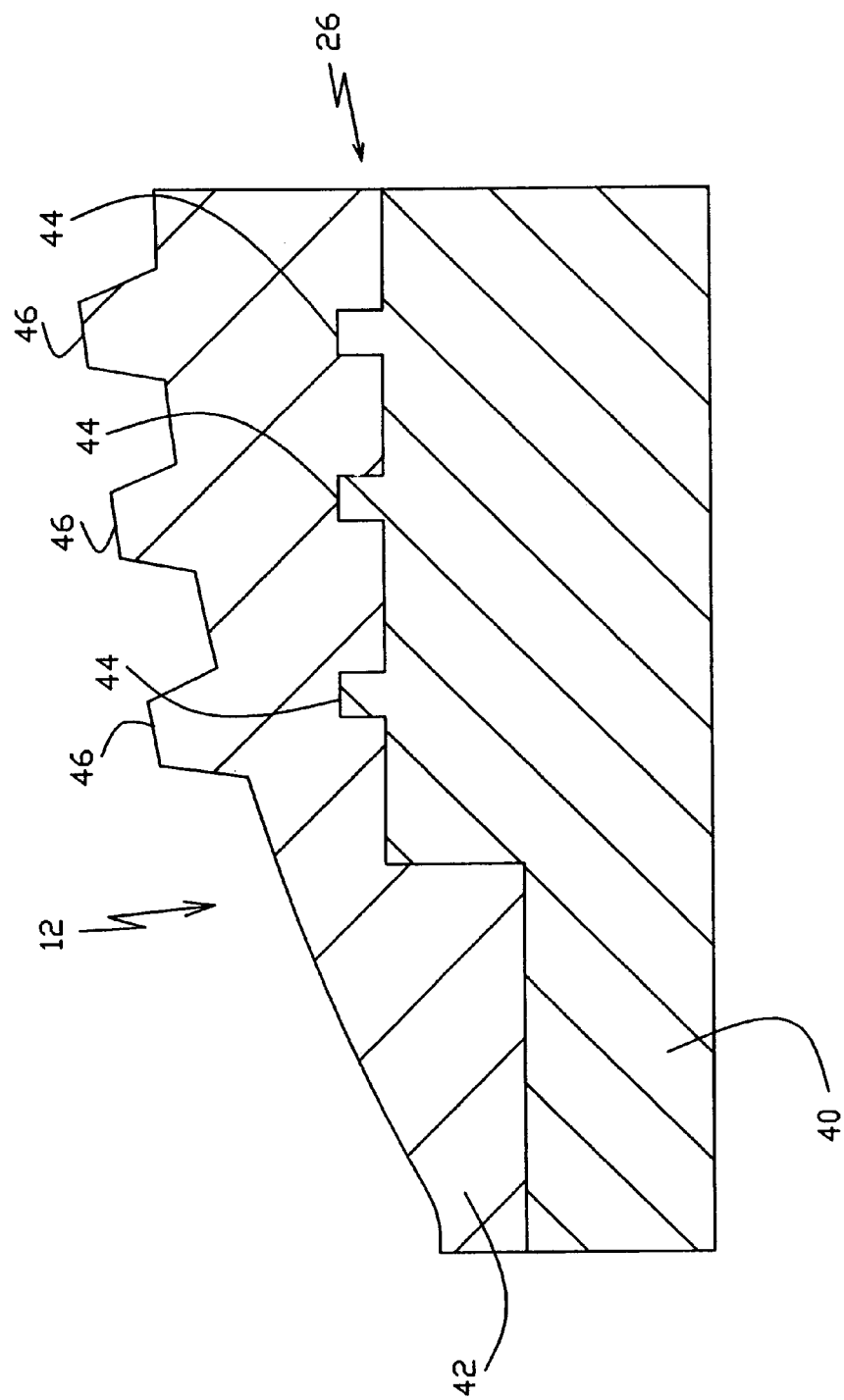
FIG. 5 is a schematic cross section of two layers, showing distortion of a stepper key.

The combination of high residual values on the stepper and low residual values on the overlay measurement tool indicates inaccurate reading of stepper keys by the stepper. This could be caused by distortion of stepper keys 26. This also could be caused by non-uniform coverage of the second layer by the first layer, as illustrated in FIG. 5. FIG. 5 is a schematic cross-section of a portion of an external scribe 12, with a second layer 42 overlaying a stepper key 26 of a first layer 40 non-uniformly, showing laterally non-uniform raised features 46 of second layer 42 that correspond to laterally uniform raised features 44 of stepper key 26.

The combination of high residual values on the stepper and high residual values on the overlay measurement tool indicates distortion of wafer 14, possibly due to differential expansion during thermal processing or to mechanical bending.

Obviously, such a combination of residual values can be effected only if two independent sets of residual values are determined, and can not be obtained from one set of residuals alone.

While the invention has been described with respect to a limited number of embodiments, it will be appreciated that many variations, modifications and other application of the invention may be made.

What is claimed is:

1. A method of monitoring the quality of a fabrication process of dies on a wafer by successive deposition on the wafer of a first layer and a second layer, the dies being separated by scribes, the method comprising the steps of:
   (a) obtaining a first measure of an alignment of the second layer relative to the first layer;
   (b) obtaining a second measure of said alignment of the second layer relative to the first layer;
   (c) obtaining a measure of a quality of a first model of said alignment, based on said first measure of said alignment;
   (d) obtaining a measure of a quality of a second model of said alignment, based on said second measure of said alignment; and
   (e) combining said measure of said quality of said first model with said measure of said quality of said second model.

2. The method of claim 1, wherein said obtaining of said first measure of said alignment is effected by steps including:
   (i) including a plurality of stepper keys in the first layer, each of said stepper keys having a nominal position; and
   (ii) determining deviations of actual positions of said stepper keys from said nominal positions thereof;
   said first measure of said alignment including said deviations of said actual positions of said stepper keys from said nominal positions thereof.

3. The method of claim 2, wherein said stepper keys are located in the scribes.

4. The method of claim 2, wherein said obtaining of said measure of said quality of said first model includes the steps of:
   (A) fitting said deviations of said actual positions of said stepper keys to said first model; and
   (B) deriving residuals of said first model; said measure of said quality of said first model then including at least one statistic of said residuals.

5. The method of claim 4, wherein said at least one statistic includes at least one standard deviation.

6. The method of claim 1, wherein said first model includes at least one degree of freedom selected from the group consisting of translations, rigid rotations, orthogonal rotations and scaling.

7. The method of claim 1, wherein said obtaining of said second measure of said alignment is effected by steps including:
   (i) including a plurality of first overlay keys in the first layer;

(ii) including a plurality of second overlay keys in the second layer, each said second overlay key corresponding to a unique one of said first overlay keys, each said first overlay key having a nominal position relative to said corresponding second overlay key;

(iii) determining a measure of deviations of actual positions of said first overlay keys, relative to said corresponding second overlay keys, from said nominal positions thereof;

said second measure of said alignment including said deviations of said actual positions of said first overlay keys, relative to said corresponding second overlay keys, from said nominal positions thereof.

8. The method of claim 7, wherein said first alignment keys and said second alignment keys are located in the scribes.

9. The method of claim 7, wherein said obtaining of said measure of said quality of said second model includes the steps of:

(A) fitting said deviations of said actual positions of said first overlay keys to said second model; and (B) deriving residuals of said second model;

said measure of said quality of said second model then including at least one statistic of said residuals.

10. The method of claim 9, wherein said at least one statistic includes at least one standard deviation.

11. The method of claim 1, wherein said second model includes at least one degree of freedom selected from the group consisting of translations, rigid rotations, orthogonal rotations, reticle rotations, scaling and magnification.

12. The method of claim 1, wherein said combining is effected by comparing said measure of said quality of said model to said measure of said quality of said second model.

* * * * *